United States Patent [19]

Sase

[11] Patent Number: 5,212,410
[45] Date of Patent: May 18, 1993

[54] REGISTER CIRCUIT IN WHICH A STOP CURRENT MAY BE MEASURED

[75] Inventor: Ryuichi Sase, Tokyo, Japan

[73] Assignee: NEC Corporation, Tokyo, Japan

[21] Appl. No.: 857,768

[22] Filed: Mar. 26, 1992

[30] Foreign Application Priority Data

Mar. 26, 1991 [JP] Japan .................. 3-061726

[51] Int. Cl.$^5$ ............... H03K 3/356; H03K 17/22
[52] U.S. Cl. ................ 307/272.3; 307/279; 307/290
[58] Field of Search ............. 307/272.1, 272.2, 272.3, 307/279, 290, 291

[56] References Cited

U.S. PATENT DOCUMENTS

| | | | |
|---|---|---|---|
| 3,676,702 | 7/1972 | McGrogran, Jr. | 307/279 |
| 3,781,573 | 12/1973 | Weeden, Jr. | 307/272.2 |
| 3,812,384 | 5/1974 | Skorup | 307/238 |
| 4,506,165 | 3/1985 | Gulati et al. | 307/272.2 |
| 4,806,786 | 2/1989 | Valentine | 307/279 |
| 4,849,653 | 7/1989 | Imai et al. | 307/290 |
| 4,877,978 | 10/1989 | Platt | 307/473 |
| 4,913,325 | 4/1990 | Yamada | 307/592 |
| 4,970,407 | 11/1990 | Patchen | 307/272.2 |
| 5,001,369 | 3/1991 | Lee | 307/473 |
| 5,095,225 | 3/1992 | Usui | 307/279 |
| 5,107,137 | 4/1992 | Kinugasa et al. | 307/272.2 |
| 5,132,577 | 7/1992 | Ward | 307/570 |
| 5,165,046 | 11/1992 | Hesson | 307/270 |

FOREIGN PATENT DOCUMENTS

| | | | |
|---|---|---|---|
| 0215494 | 3/1987 | European Pat. Off. | 307/272.2 |
| 0002715 | 1/1987 | Japan | 307/272.2 |
| 0252211 | 11/1987 | Japan | 307/272.2 |
| 0018814 | 1/1988 | Japan | 307/272.2 |

Primary Examiner—William L. Sikes
Assistant Examiner—Terry D. Cunningham
Attorney, Agent, or Firm—Laff, Whitesel, Conte & Saret

[57] ABSTRACT

An output terminal of a register circuit in an LSI circuit such as a microcomputer, etc. is set to be a set state and is reset to be a reset state in accordance with set and reset signals and a clock-stop signal which is generated at a stop mode. A stop current is measured to flow between a predetermined node of the register circuit at the set state, and between the predetermined node and a power supply at the reset state.

2 Claims, 4 Drawing Sheets

REGISTER CIRCUIT IN WHICH A STOP CURRENT MAY BE MEASURED

FIELD OF THE INVENTION

The invention relates to a register circuit, and more particularly to, a register circuit having a low power consumption mode set by maintaining an internal clock to be a constant level.

BACKGROUND OF THE INVENTION

A conventional register circuit comprises a parallel circuit of N and P channel type transistors connected to an input terminal, a feedback loop circuit of two inverters for feeding an output signal of the parallel circuit back to an input thereof, and an output inverter connected to an output terminal for inverting an output signal of the feedback loop circuit to be supplied to the output terminal.

In operation, when a clock signal of "high" and an inverted clock signal of "low" are applied to the N and P channel transistors of the parallel circuit, respectively, the parallel circuit is turned on, so that an input signal applied to the input terminal is transmitted through the parallel circuit to the feedback loop circuit. Here, if it is assumed that a feedback inverter of the two inverters of the feedback loop circuit has a sufficient large ON resistance, the input signal is transmitted through a remaining inverter of the feedback loop circuit and the output inverter to the output terminal.

Next, when the clock signal becomes low, while the inverted clock signal becomes high, the parallel circuit is turned off, so that an input signal supplied to the parallel circuit at the time just prior to the turning-off of the parallel circuit becomes an output signal obtained at the output terminal by the function of the feedback loop circuit. At this moment, when a stop mode is instructed to be carried out, that is, the clock signal of "low" and the inverted clock signal of "high" are maintained for a predetermined time, the output signal equal to the input signal is obtained at the output terminal.

Such a register circuit is associated with large scale integrated circuit (LSI) circuit of a microprocessor, a microcomputer, etc., wherein a stop current, which is defined to be a power supply current flowing through the register circuit operating under a stop mode, must be less than a predetermined value which is prescribed in a data sheet.

The term "stop mode" refers to a situation where, an LSI is turned on and is being supplied power, but the memory stops taking in data for a brief period of time. A central processor (CPU) stops the supply of clock pulses in order to decrease current consumption. The term "stop current" refers to a leakage current which flows through the register circuit. As will become more apparent as this specification continues, a "stop current" is in a circuit traced from the power supply 10 (FIG. 4A), through transistor 8, a node at the input of invention 4, resistor 18 an insulation to ground.

For the purpose of determining register circuits to meet the requirement of the data sheet, the stop current is measured in each register circuit.

In this respect, if a stop mode is instructed to a register circuit, when an input signal supplied to the register circuit is high, a stop current flowing between an input of the feedback loop circuit and ground can be detected, because the input of the feedback loop circuit is at a high potential. As a result of measuring the stop current caused by the high potential at the input of the feedback loop circuit, the register circuit can be determined to be "good" or "fault".

However, the conventional register circuit has a disadvantage in that there is a case where a stop current can not be detected, so that a faulty register circuit becomes difficult to be sorted out from register circuits. That is, if a stop mode is instructed to a register circuit, when an input signal is low, a stop current can not flow, because a potential is low at the input of the feedback loop circuit. This makes the design of test pattern complicated and the design steps thereof large in number.

SUMMARY OF THE INVENTION

Accordingly, it is an object of the invention to provide a register circuit in which a stop current is detected at any state.

It is a further object of the invention to provide a register circuit contributing to increase reliability and quality of an LSI circuit.

According to the invention, a register circuit, comprises:

a first gate circuit to be applied with a clock-stop signal and a register circuit-set signal to generate a first gate signal;

a second gate circuit to be applied with the clock-stop signal and a register circuit-reset signal to generate a second gate signal; and a circuit for setting an output of the register circuit to be a set state by receiving the first gate signal, and resetting the output of the register circuit to be a reset state by receiving the second gate signal.

BRIEF DESCRIPTION OF THE DRAWINGS

The invention will be explained in more detail in conjunction with appended drawings, wherein.

DESCRIPTION OF THE PREFERRED EMBODIMENTS

Figure 1:
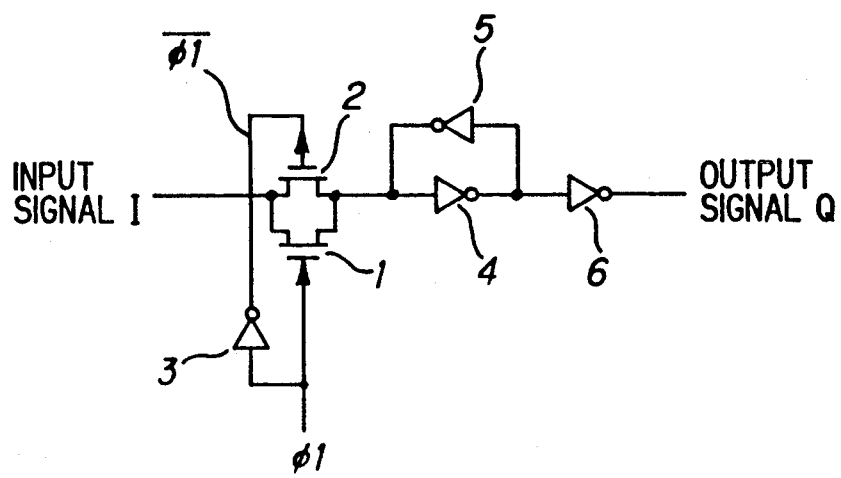
FIG. 1 is a circuit diagram showing a conventional register circuit.

Before explaining a register circuit according to the invention, the aforementioned conventional register circuit will be explained in FIG. 1.

The conventional register circuit comprises a parallel circuit of N and P channel type transistors 1 and 2, a feedback loop circuit of inverters 4 and 5, and an output inverter 6. In the parallel circuit, the N channel type transistor 1 is supplied with a clock signal $\phi 1$ at a gate, and the P channel type transistor 2 is supplied with an inverted clock signal $\bar{\phi} 1$ at a gate connected to an inverter 3, wherein an input terminal is connected to a first common node of source-drain paths of the N and P channel type transistors 1 and 2, and the feedback loop circuit is connected to a second common node thereof. In the feedback loop circuit, the inverter 4 is connected at an input to the second common node of the source-drain paths of the N and P channel type transistors 1 and 2 and at an output to the output inverter 6 having an output for an output terminal of the register circuit, and the feedback inverter 5 is connected at an input to the output of the inverter 4 and at an output to the input of the inverter 4.

In operation, when the clock signal $\phi1$ and the inverted clock signal $\overline{\phi1}$ for operating an LSI circuit become high and low, respectively, to be applied to the N and P channel type transistors 1 and 2 providing the parallel circuit, the parallel circuit is turned on, so that the input signal I is transmitted through the parallel circuit to be an input signal of the feedback loop circuit. As described before, the ON resistance of the inverter 5 is sufficiently large, so that the input signal I is transmitted through the inverters 4 and 6 to the output terminal as the output signal Q. Then, when the clock signal $\phi1$ and the inverted clock signal $\overline{\phi1}$ become low and high, respectively, the parallel circuit is turned off, so that the input signal I supplied just prior to the turning-off of the parallel circuit to the feedback loop circuit is obtained as the output signal Q at the output terminal.

When the stop mode is instructed to the register circuit at the state that the clock signal $\phi1$ and the inverted clock signal $\overline{\phi1}$ are low and high, respectively, the same output signal Q as the input signal I just prior to the turning-off of the parallel circuit to the feedback loop circuit is obtained at the output terminal.

Figure 2:
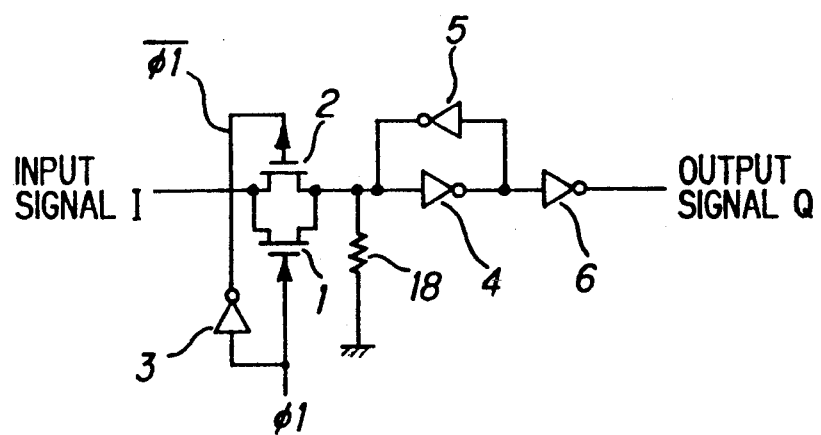
FIG. 2 is a circuit diagram explaining how to measure a stop current in the conventional register circuit.

One example of measuring a stop current in the conventional register circuit is shown in FIG. 2. Here, if it is assumed that the input signal is high, a stop current will flow from the input of the feedback loop circuit through a ground resistance 18 to ground. When the stop current is over a specified value, the register circuit is found to be defective.

On the other hand, if the input signal I is low, no stop current flows from the input of the feedback loop circuit to ground regardless of the value of the ground resistance 18. This means that the possibility of measuring the stop current of register circuits is affected by the signal state of input signals applied thereto, so that a test pattern of LSI circuits is made complicated and steps of designing the test pattern become large in number.

Figure 3A:
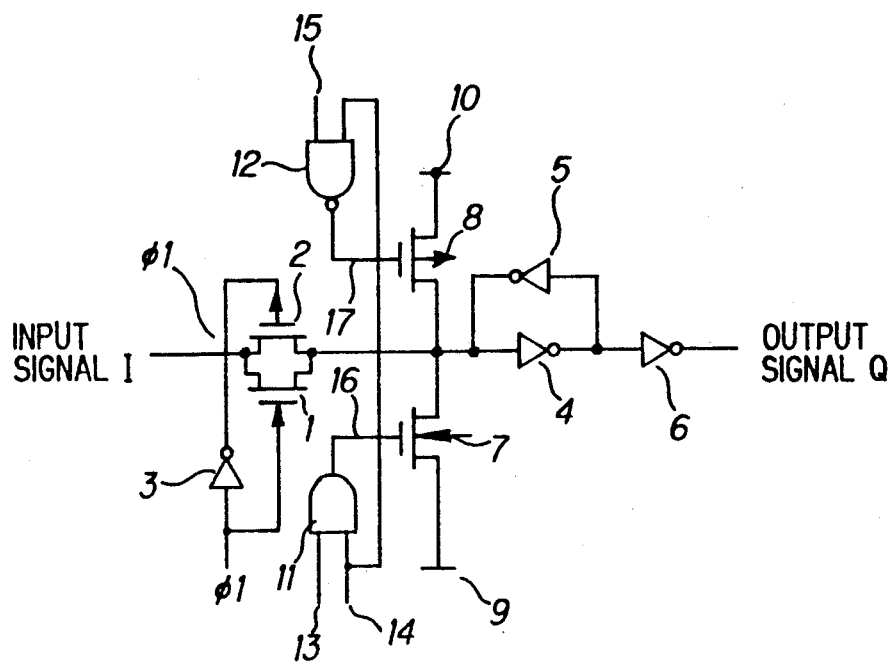
FIG. 3A is a circuit diagram showing a register circuit of a preferred embodiment according to the invention.

Next, a register circuit of a preferred embodiment according to the invention will be explained in FIG. 3A, wherein like parts are indicated by like references as used in FIGS. 1 and 2.

The register circuit comprises an N channel type transistor 7 and a P channel type transistor 8 connected, respectively, between a common node of the parallel circuit including the N and P channel type transistors 1 and 2 and the feedback loop circuit including the inverters 4 and 5 and ground 9, and between the common node and a power supply 10, a first gate circuit 12 for receiving a stop signal 14 and a set signal 15 setting the output signal Q to be high and supplying a first gate signal to a gate 17 of the P channel type transistor 8, and a second gate circuit 11 for receiving the stop signal 14 and a reset signal 13 setting the output signal Q to be low and supplying a second gate signal to a gate 16 of the N channel type transistor 7.

Figure 3B:
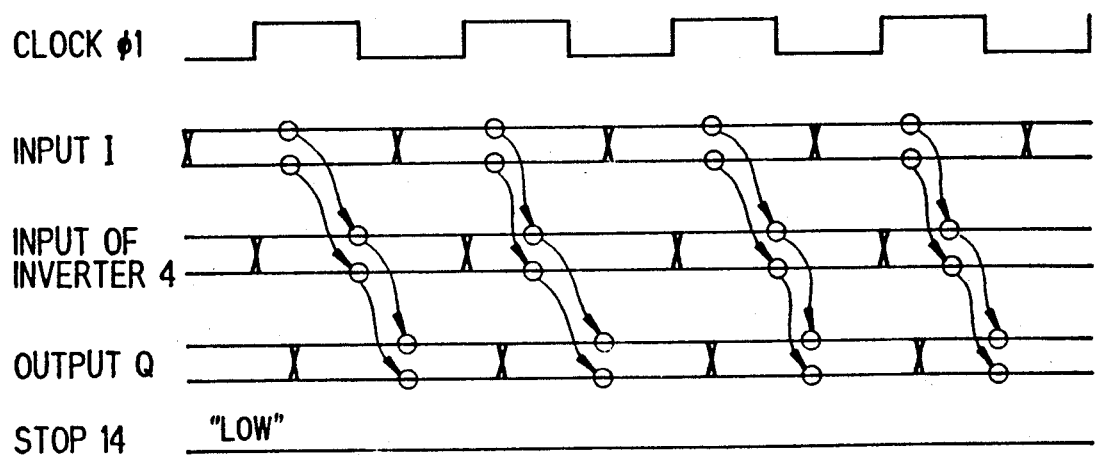
FIG. 3B is a timing chart explaining operation of the register circuit of the preferred embodiment.

FIG. 3B shows ordinary operation in which the stop signal is low, so that the P channel type transistor 8 is supplied at the gate 17 with the first gate signal of "high" and the N channel type transistor 7 is supplied at the gate 16 with the second gate signal of "low". Thus, the P and N channel type transistors 8 and 7 are turned off.

At this state, the clock signal $\phi1$ and the inverted clock signal $\overline{\phi1}$ continue to be applied to the N and P channel type transistors 1 and 2 providing the parallel circuit, so that the parallel circuit is turned on and off periodically. When the parallel circuit is turned on, the input signal I is transmitted through the parallel circuit to the input of the feedback loop circuit, and therefrom to the output terminal as the output signal Q, as shown in FIG. 3B. On the other hand, when the parallel circuit is turned off, the input signal I supplied just prior to the turning-off of the parallel circuit to the feedback loop circuit is obtained as the output signal Q at the output terminal, as also shown in FIG. 3B.

Figure 4A:
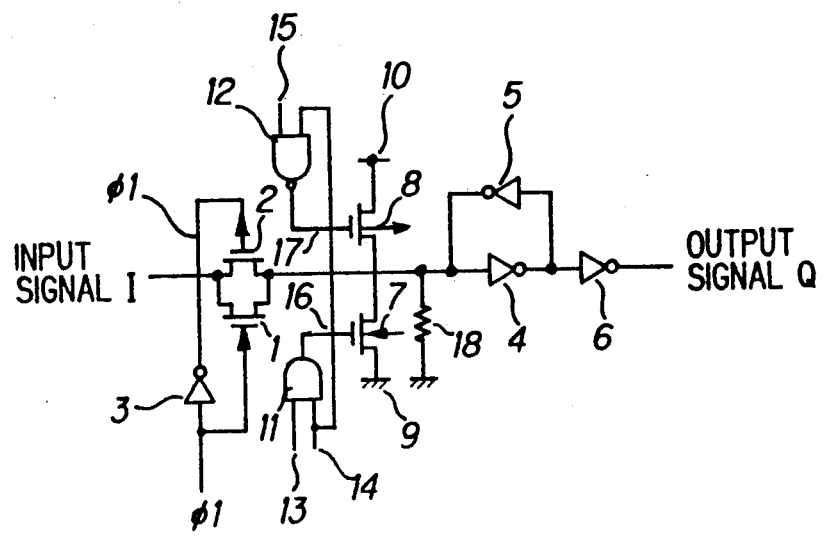
FIGS. 4A and 5A are circuit diagrams showing circuit diagrams explaining how to measure a stop current in the register circuit of the preferred embodiment.

Next, it is assumed that the common node between the parallel circuit and the feedback loop circuit is coupled through a resistance 18 to ground, as shown in FIG. 4A.

Figure 4B:
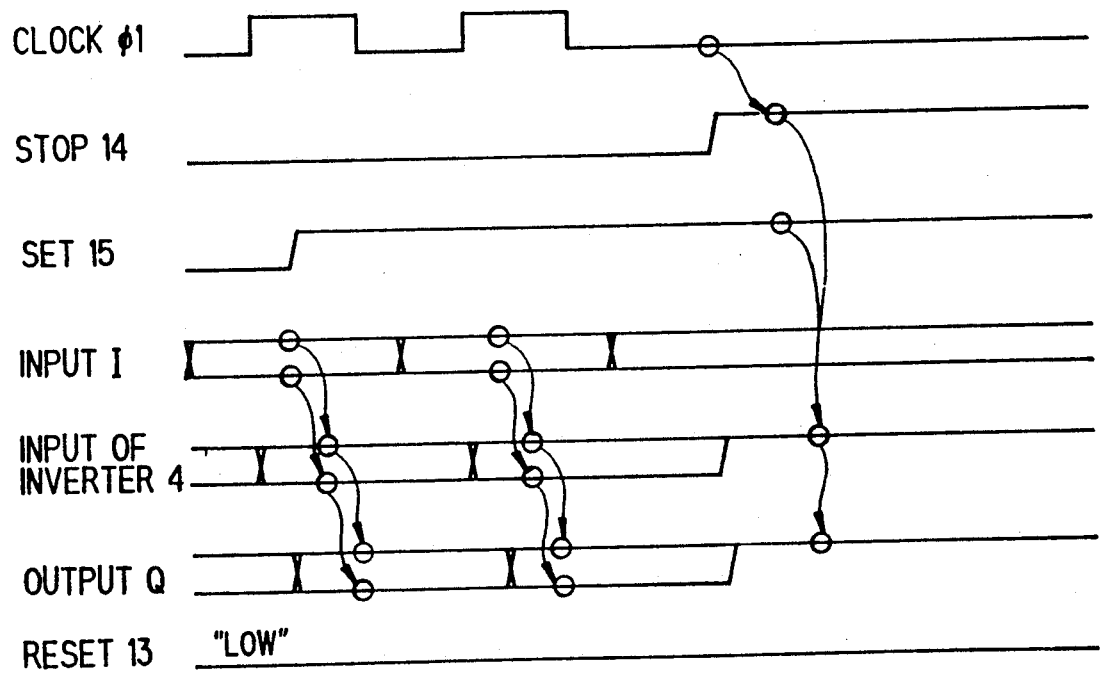
FIGS. 4B and 5B are timing charts explaining how to measure a stop current in the register circuit of the preferred embodiment.

In FIG. 4B, the clock signal $\phi1$ and the inverted clock signal $\overline{\phi1}$ (not shown) stop to be low and high, so that the parallel circuit is turned off. At the same time, the stop signal 14 becomes high to instruct the LSI circuit to be set in the stop mode. Before that, the set signal becomes high to be applied to the first gate circuit 12, while the reset signal 13 remains low to be applied to the second gate circuit 11, so that the P channel type transistor 8 will be turned on upon the high level of the stop signal 14, while the N channel type transistor 7 will remain turned off. Thus, the stop current flowing from the power supply 10 through the P channel type transistor 8 and the resistance 18 to ground can be measured. If the measured stop current is over a specified value, the register circuit is found to be defective.

Figure 5A:
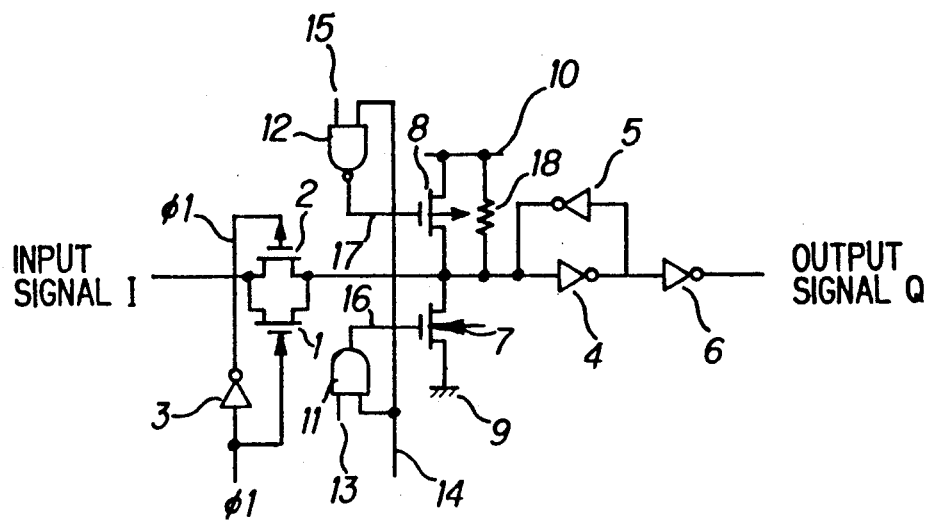

Next, it is assumed that the common node between the parallel circuit and the feedback loop circuit is short-circuited through a resistance 18 to the power supply 10, as shown in FIG. 5A.

Figure 5B:
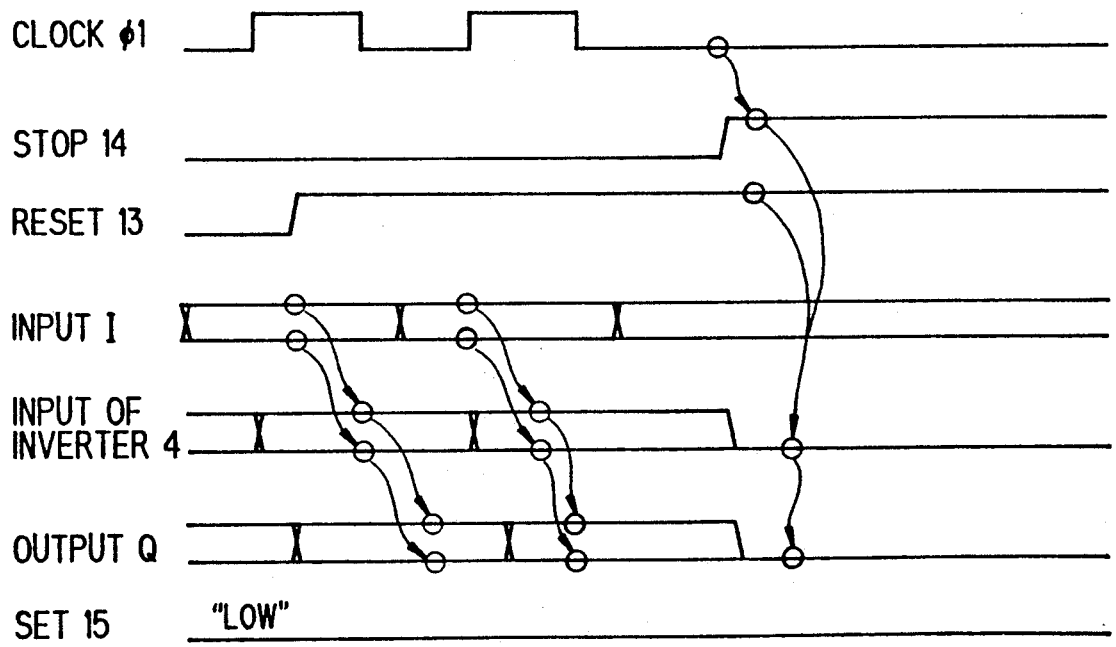

In FIG. 5B, the clock signal $\phi1$ and the inverted clock signal $\overline{\phi1}$ (not shown) stop to be low and high, so that the parallel circuit is turned off. At the same time, the stop signal 14 becomes high to instruct the LSI circuit to be set in the stop mode. Before that, the reset signal 13 becomes high to be applied to the second gate circuit 13, while the set signal 15 remains low to be applied to the first gate circuit 12, so that the N channel type transistor 7 will be turned on upon the high level of the stop signal 14, while the P channel type transistor 8 will remain turned off. Thus, the stop current flowing from the power supply 10 through the resistance 18 and the N channel type transistor 7 to ground can be measured. If the measured stop current is over a specified value, the register circuit is found to be defective.

In the preferred embodiment, the set and reset signals 15 and 13 may be included in a combination of instructions for a an LSI circuit. In such a case, the set and reset signals 15 and 13 are applied to all register circuits included in the LSI circuit simultaneously by one instruction, so that the stop current can be measured in the all register circuits.

Although the invention has been described with respect to specific embodiment for complete and clear disclosure, the appended claims are not to be thus limited but are to be construed as embodying all modification and alternative constructions that may occur to one skilled in the art which fairly fall within the basic teaching herein set forth.

What is claimed is:

1. A register circuit, comprising:
   a parallel circuit of N and P channel type transistors connected between an input terminal and a first predetermined node, gates of said N and P channel type transistors being coupled to receive clock pulse and inverted clock pulse signals respectively;
   a feedback loop circuit of a transmission invertor and a feedback invertor connected between said first predetermined node and a second predetermined node;
   an output invertor connected between said second predetermined node and an output terminal;
   a first gate circuit coupled to receive a clock-stop signal and a register circuit-set signal to generate a first gate signal;
   a second gate circuit to receive said clock-stop signal and a register circuit-reset signal to generate a second gate signal; and
   a circuit for setting an output of said register circuit to a set state in responses to said first gate signal, and for resetting said output of said register circuit to a reset state in response said second gate signal.

2. A register circuit, according to claim 1, wherein:
   said setting and resetting circuit further comprises a P channel type transistor connected between said first predetermined node and a power supply terminal and having a gate coupled to receive said first gate signal, and an N channel type transistor connected between said first predetermined node and a ground terminal and having a gate said coupled to receive second gate signal, whereby a leakage current flowing between said first predetermined node and ground, when said P channel type transistor is turned on, and said N channel type transistor is turned off, can be measured and a leakage current flowing to a current between said power supply and said first predetermined node, when said P channel type transistor is turned off and said N channel type transistor is turned on can be measured.

* * * * *